(12) United States Patent
Tsukio

(10) Patent No.: US 10,122,267 B2
(45) Date of Patent: Nov. 6, 2018

(54) ELECTRONIC CONTROL DEVICE

(71) Applicant: Hitachi Automotive Systems, Ltd., Hitachinaka-shi, Ibaraki (JP)

(72) Inventor: Koichi Tsukio, Hltachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/313,270

(22) PCT Filed: May 7, 2015

(86) PCT No.: PCT/JP2015/063157
§ 371 (c)(1),
(2) Date: Nov. 22, 2016

(87) PCT Pub. No.: WO2015/178199
PCT Pub. Date: Nov. 26, 2015

(65) Prior Publication Data
US 2017/0201172 A1    Jul. 13, 2017

(30) Foreign Application Priority Data
May 23, 2014 (JP) ................. 2014-106641

(51) Int. Cl.
*G05F 1/10* (2006.01)
*G05F 3/02* (2006.01)
(Continued)

(52) U.S. Cl.
CPC ............... *H02M 3/07* (2013.01); *H03K 5/19* (2013.01)

(58) Field of Classification Search
CPC .................................. H02M 3/07; H03K 5/19
(Continued)

(56) References Cited

U.S. PATENT DOCUMENTS

2008/0289607 A1    11/2008    Mayuzumi et al.
2009/0015223 A1*    1/2009    Kakehi ................... F02D 41/20
                                                                    323/282
(Continued)

FOREIGN PATENT DOCUMENTS

EP    2 503 846 A1    9/2012
JP    2002-176767 A    6/2002
(Continued)

OTHER PUBLICATIONS

International Search Report (PCT/ISA/210) issued in PCT Application No. PCT/JP2015/063157 dated Jul. 21, 2015 with English-language translation (four (4) pages).
(Continued)

*Primary Examiner* — Lincoln Donovan
*Assistant Examiner* — Metasebia Retebo
(74) *Attorney, Agent, or Firm* — Crowell & Moring LLP

(57) ABSTRACT

In a step-up circuit, which is an electronic control device, changes in current caused by a current rise when stepping up is started and a current drop when stepping up is stopped generate magnetic induction noise due to fluctuations in the electromagnetic induction voltage in signal lines around the step-up circuit. The present invention is a step-up circuit for stepping up by current control, wherein the step-up circuit is provided with a plurality of target current values for retaining a step-up current so that the current is raised in a stepwise manner when stepping up is started and dropped in a stepwise manner when stepping up is stopped. The present invention reduces electromagnetic induction noise generated by the changes in current when stepping up is started and when stepping up is stopped.

6 Claims, 6 Drawing Sheets

(51) Int. Cl.
*H02M 3/07* (2006.01)
*H03K 5/19* (2006.01)

(58) Field of Classification Search
USPC .......................................................... 327/536
See application file for complete search history.

(56) References Cited

U.S. PATENT DOCUMENTS

| | | |
|---|---|---|
| 2012/0194961 A1 | 8/2012 | Yamada et al. |
| 2013/0049459 A1 | 2/2013 | Hatanaka et al. |
| 2014/0124601 A1 | 5/2014 | Imai |

FOREIGN PATENT DOCUMENTS

| | | | |
|---|---|---|---|
| JP | 2004-96937 A | | 3/2004 |
| JP | 2006-141184 A | | 6/2006 |
| JP | 2008-169762 A | | 7/2008 |
| JP | 2009-5432 A | | 1/2009 |
| JP | 2009-254014 A | | 10/2009 |
| JP | 2009261040 A | * | 11/2009 |
| JP | 2011-10380 A | | 1/2011 |
| JP | 2011-10512 A | | 1/2011 |
| JP | 2012-159049 A | | 8/2012 |
| JP | 2013-253530 A | | 12/2013 |

OTHER PUBLICATIONS

Japanese-language Written Opinion (PCT/ISA/237) issued in PCT Application No. PCT/JP2015/063157 dated Jul. 21, 2015 (four (4) pages).

Japanese-language Office Action issued in counterpart Japanese Application No. 2016-521023 dated Dec. 12, 2017 with English translation (Six (6) pages).

European Search Report issued in counterpart European Application No. 15796854.6 dated Jun. 18, 2018 (eleven (11) pages).

* cited by examiner

ELECTRONIC CONTROL DEVICE

TECHNICAL FIELD

The present invention relates to a step-up circuit in an electronic control device.

BACKGROUND ART

JP 2013-253530 A shows a background art.

In this patent literature, a step-up converter in a fuel injector repeats ON/OFF of a current between an upper and lower limit values of a threshold so as to maintain an average current constant by switching control. Also, when the current value reaches a certain value, the average current is maintained to be constant. Stepping up from start to the above certain value is performed at one time, not in a stepwise manner. According to the above, the higher the average current value to be maintained constant is, the larger the current fluctuation at the time when stepping up is started is. Accordingly, voltage changes in signal lines around the circuit is generated by electromagnetic induction. Also, when stepping up is stopped, the larger the average current value to be maintained constant is, the larger the current drop amount is. Therefore, similarly to the above, voltage changes in the signal lines around the circuit are generated by the electromagnetic induction. Since the voltage changes in the signal lines are not intended, there is a possibility that the voltage changes cause a circuit malfunction.

Also, for example, JP 2012-159049 A shows another background art. In the present patent literature, a step-up switching element and a switching element for controlling fuel injection valve opening are concurrently turned ON in a fuel injector, and a current flown into the fuel injecting valve is increased from zero. When the current value reaches the upper limit value, the switching element of the step-up circuit is blocked. After that, the current flown into the fuel injecting valve is continuously increased by the current supplied from the switching element for controlling the fuel injection valve opening due to a rise of a power source voltage and the like. In this case, since the current exceeds the current upper limit threshold of a target current value, the current cannot be suppressed. Therefore, the current is stably retained by having a second current upper limit threshold. In the present patent literature, similarly to the above, stepping up from the start to the target current value is performed at one time. Accordingly, the larger the target current value is, the larger the current fluctuation generated at the time when stepping up is started and stopped is, and the voltage changes caused by electromagnetic induction have a large effect on the signal lines around the circuit. Since the voltage changes in the signal lines are not intended, there is a possibility that the voltage changes cause a circuit malfunction.

CITATION LIST

Patent Literatures

PTL 1: JP 2013-253530 A
PTL 2: JP 2012-159049 A
PTL 3: JP 2008-169762 A

SUMMARY OF INVENTION

Technical Problem

The step-up circuit for controlling the fuel injection valve opening according to PTL 3 controls the step-up voltage by using the current. The target current value increases in proportion to the target voltage. Also, a desired voltage value is obtained by continuing to turn ON the step-up switching element until the current reaches the target current value. Therefore, since the fluctuation of the current flown into the step-up circuit gets larger when the target voltage value is set to be high, that is, when the target current value is set to be high, voltage changes caused by electromagnetic induction is generated in signal lines arranged around the step-up circuit. Since the voltage changes in the signal lines are not intended, there is a possibility that the voltage changes cause a circuit malfunction.

A purpose of the present invention is to reduce voltage changes generated by electromagnetic induction caused by a rapid current fluctuation generated when stepping up is started and stopped and to reduce an effect of the voltage changes to a peripheral circuit.

Solution to Problem

For example, a purpose of the present invention can be achieved by controlling current values at the time of a current rise when stepping up is started and a current drop when stepping up is stopped in a stepwise manner.

Advantageous Effects of Invention

According to the present invention, voltage changes generated by electromagnetic induction caused by a rapid current fluctuation generated when stepping up is started and stopped can be reduced and an effect of the voltage changes to a peripheral circuit can be reduced.

DESCRIPTION OF EMBODIMENTS

Embodiments of the present invention will be described in detail below with reference to the drawings.

Figure 1:
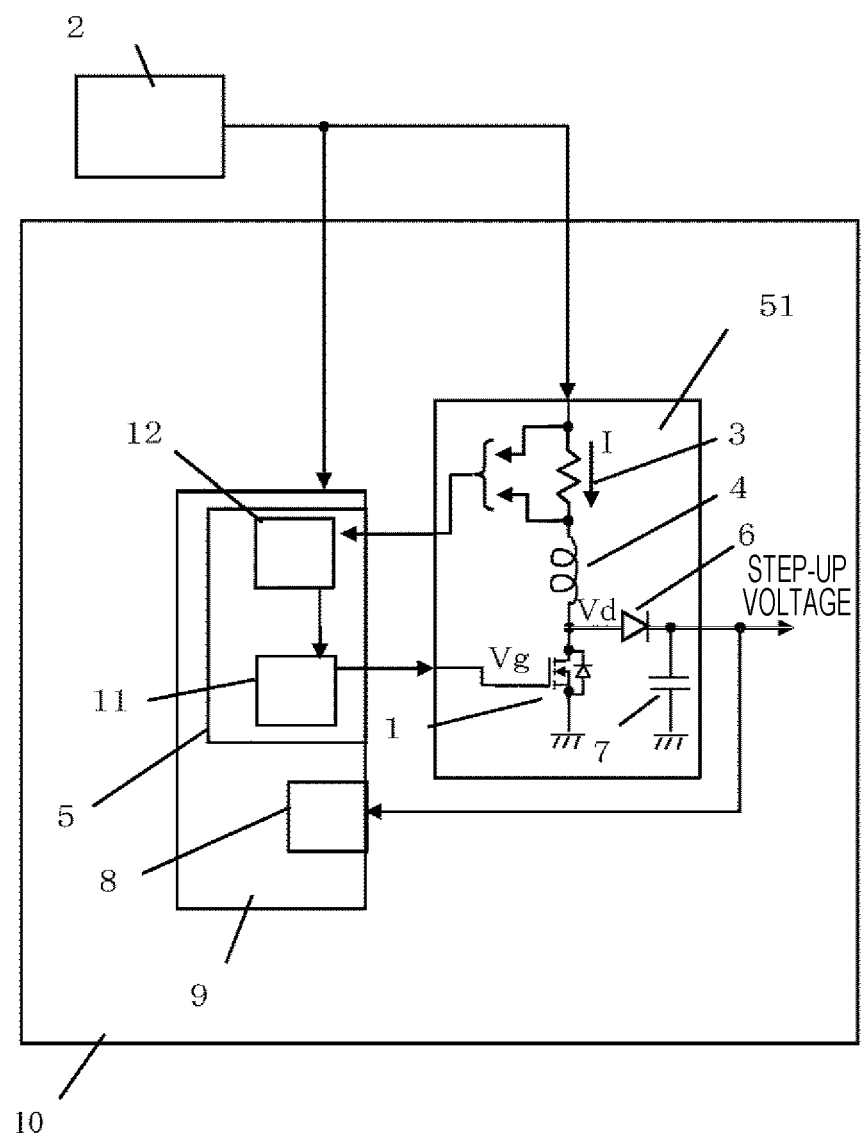
FIG. 1 is a block diagram of a circuit for generating a step-up voltage.
Figure 2:
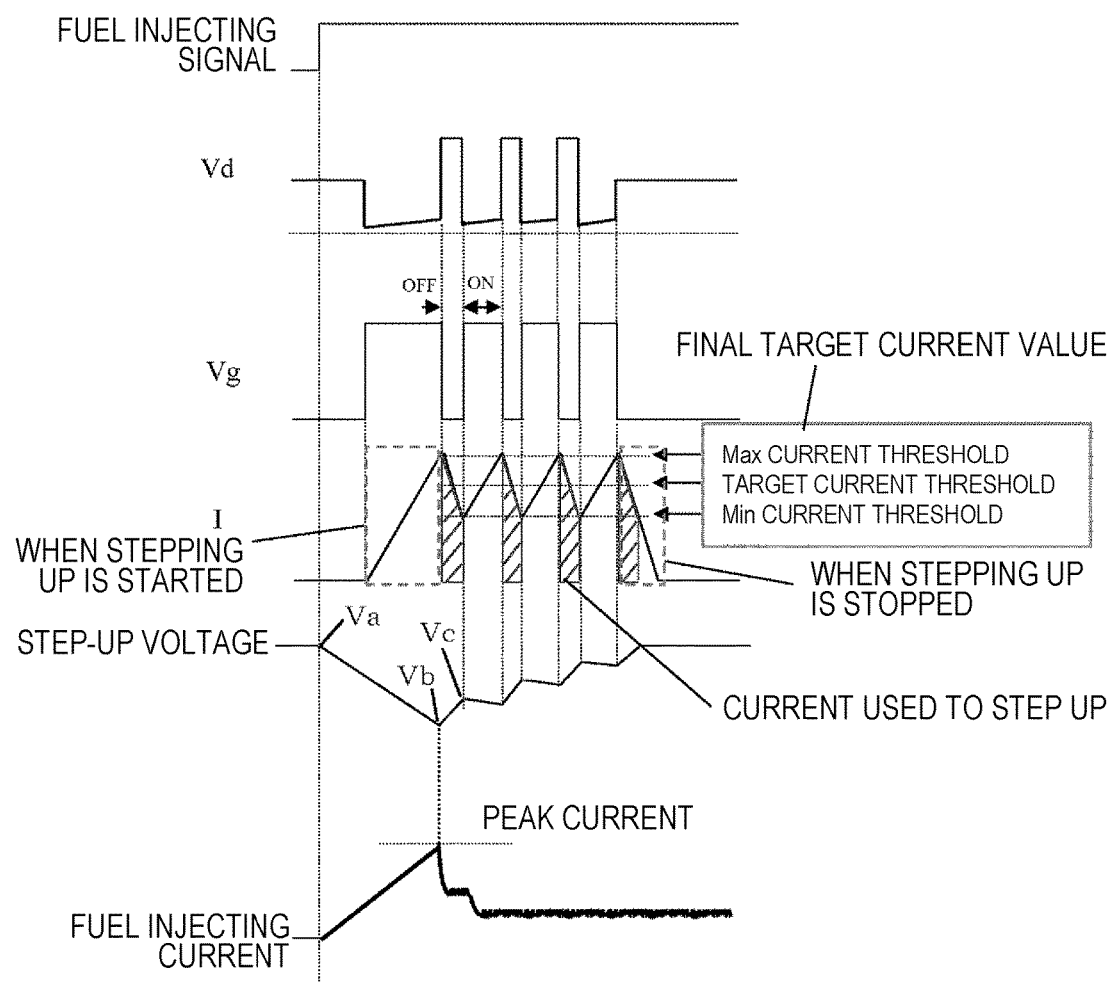
FIG. 2 is a diagram of a voltage waveform and a current waveform when the step-up voltage is generated.

A structure of a step-up circuit of a fuel injector driving circuit 10 according to the present embodiment is described with reference to FIG. 1. When a gate voltage Vg of a step-up driver 1 is turned ON, a current I is flown from a battery 2 to a GND via a shunt resistor 3, a step-up coil 4, and the step-up driver 1. The current at this time is detected by a voltage monitor 12 included in a step-up circuit driving unit 5 in a driver IC 9 as voltages on both sides of the shunt resistor 3. When the Max current threshold which has been set is detected, a step-up gate control circuit 11 turns OFF the step-up driver 1. At this time, an electromotive force of the step-up coil 4 flows the current I to a step-up diode 6. A step-up capacitor 7 temporarily stores the current flown into the diode. Next, when the current flown into the shunt resistor 3 is reduced, the step-up driver 1 is turned ON again to increase the current value. The repetition of the above operation continues the current flow into the step-up diode 6, and a step-up voltage is generated by storing the current in the step-up capacitor 7. Also, a circuit 8 for monitoring the step-up voltage is included in the step-up circuit. The circuit 8 monitors the step-up voltage to perform stepping up when the voltage is low and to stop stepping up when the voltage reaches a predetermined value. FIG. 2 is a diagram of a waveform of a step-up operation. Characters of Vg represent a gate signal for turning ON the step-up driver 1. When the gate signal Vg is turned ON, a drain voltage Vd of the step-up driver 1 is reduced to a value around zero V, and the current I increases. When the current I reaches the Max current, which has been set, relative to the target current value, the gate signal Vg of the step-up driver 1 is turned OFF. At this time, the drain voltage Vd reaches a value close to the step-up voltage, and the current I is flown to the side of the step-up diode 6 and is stored in the step-up capacitor 7. However, the current value is decreased with lapse of time. When the current value reaches the Min current which has been set, the step-up driver 1 is turned ON again. Therefore, the operation illustrated in FIG. 2 is performed by the repetition of this operation. This operation is performed until the step-up voltage reaches a set value. A hatched line area in FIG. 2 shows the current which is actually flown in the step-up diode 6, and this current is used to step up the voltage. The above operation makes the waveform of the step-up voltage in FIG. 2. When injection to a fuel driving valve is started, the step-up voltage is reduced until the step-up voltage reaches a peak current of a fuel injecting current. After reaching the peak current, the step-up voltage is not used. Therefore, the step-up voltage is gradually recovered by switching drive of the step-up circuit. When the gate signal Vg is turned OFF, the current flows into the step-up capacitor, and the step-up voltage increases. When the gate signal Vg is turned ON, the current is not flown into the step-up capacitor. Therefore, the step-up voltage does not increase (slightly reduced due to natural discharge). By repeating the above operation, stepping up by Vg switching is performed until the step-up voltage reaches a predetermined value.

A purpose of the present embodiment is to reduce a voltage fluctuation around the step-up circuit generated by electromagnetic induction caused by a current fluctuation by raising and dropping the current in a stepwise manner by using a plurality of final target current values and reducing the current fluctuation when a step-up current of the step-up coil is raised at the time when a fuel injecting current of a fuel injecting valve reaches the peak current and when the step-up current of the step-up coil is dropped after the step-up voltage has reached the predetermined value.

Figure 3:
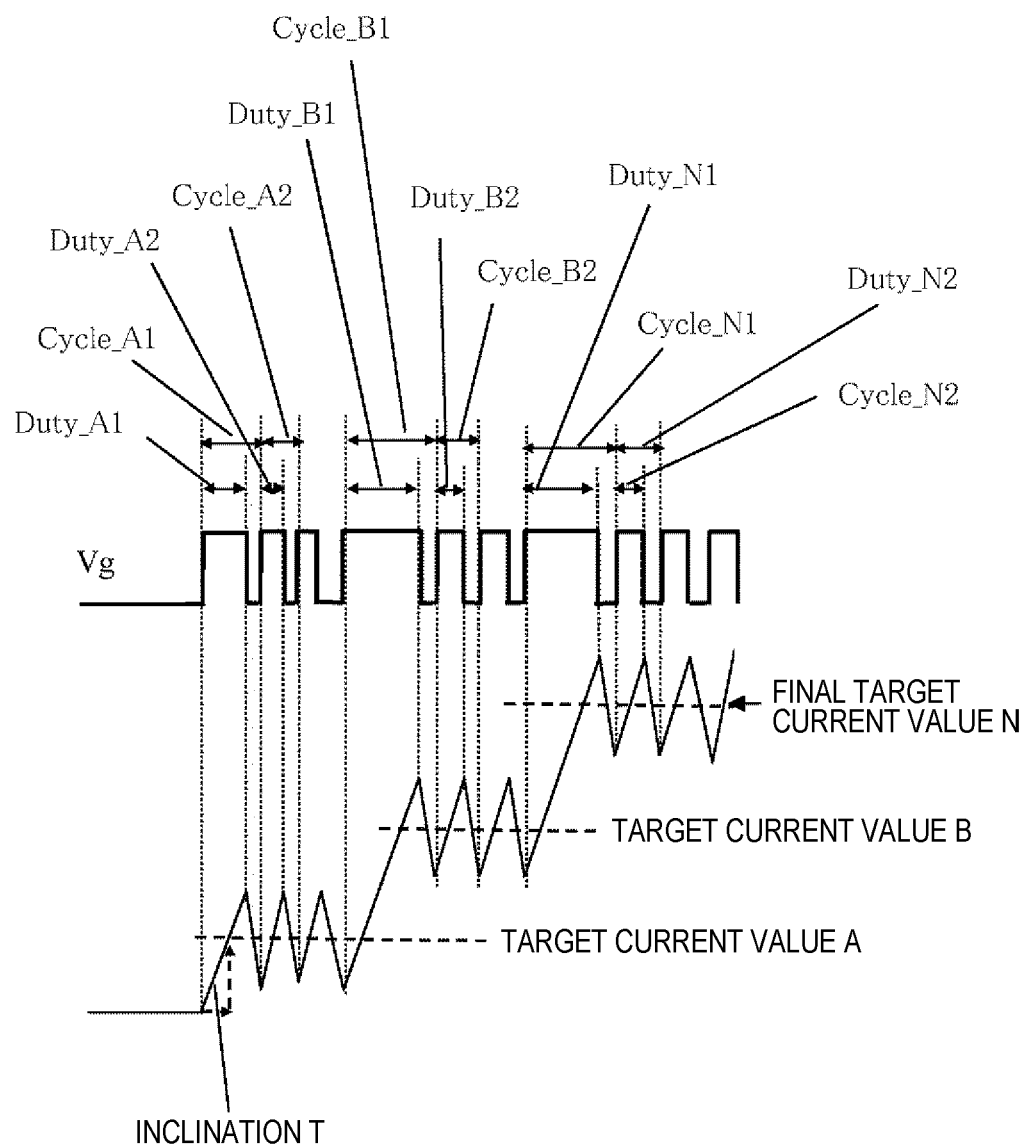
FIG. 3 is a diagram of a step-up current waveform in a case where stepping up is performed in a stepwise manner according to claim 2.

FIG. 3 is a diagram to describe an embodiment according to claims 1 and 2 of the present invention. In an example in FIG. 3, a current rise at the time when stepping up is started is controlled in a stepwise manner by varying ON/OFF Duty of a step-up switching element and a frequency. An inclination T of the current illustrated in FIG. 3 is determined based on characteristics of the circuit. Therefore, the target current value can be controlled by controlling ON/OFF time of the step-up switching element, that is, Duty and Cycle of the step-up switching element. For example, when stepping up is performed to a final target current value N in a stepwise manner, in order to perform stepping up to a target current at the first stage, it is preferable that a current value be increased to a target current value A by Duty_A1 and Cycle_A1 and the target current value A be maintained by Duty_A2 and Cycle_A2 for a certain time. Similarly to the above, stepping up at the second stage is performed by Duty_B1 and Cycle_B1, and stepping up at Nth stage is performed by Duty_N1 and Cycle_N1. By varying Duty and Cycle of the step-up switching element at a plurality of times as described above, the current can be raised at the time when stepping up is started in a stepwise manner. Similarly to the above, when the current is dropped in a stepwise manner when stepping up is stopped, the current can be dropped in a stepwise manner by varying Duty and Cycle of the step-up switching element at a plurality of times.

Figure 4:
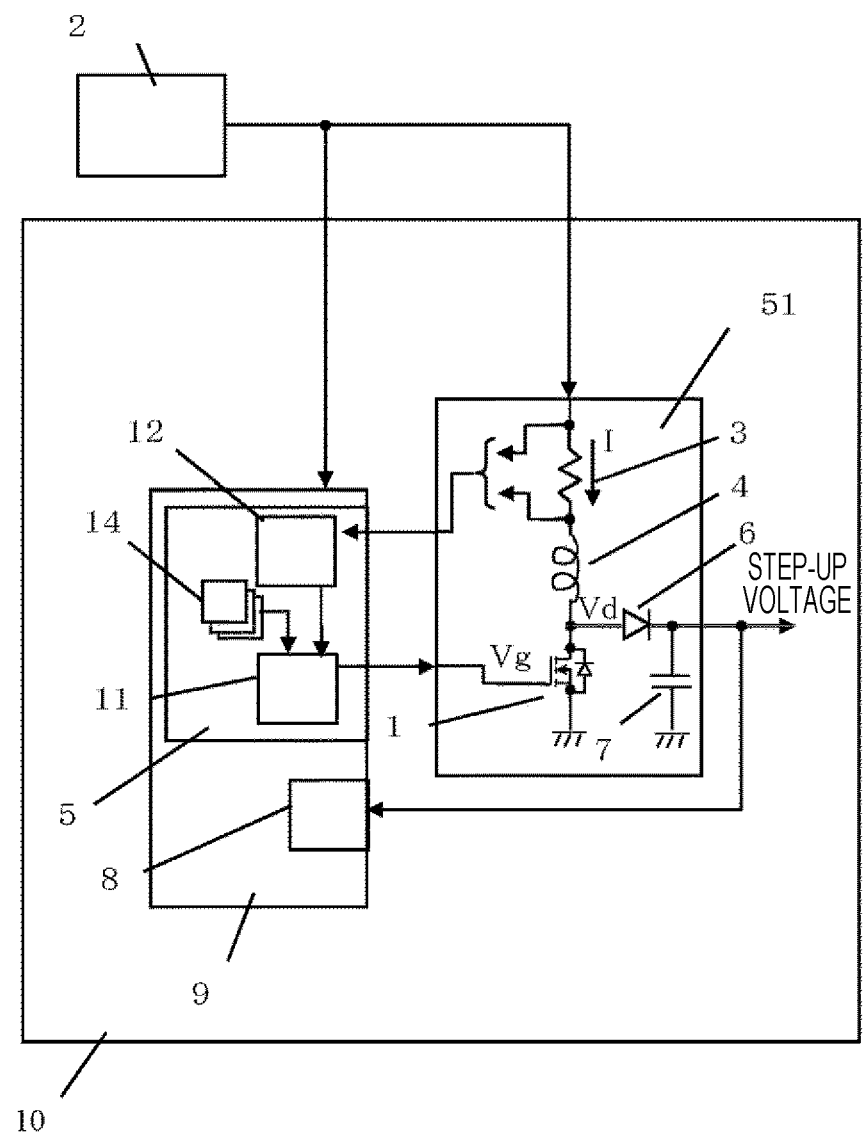
FIG. 4 is a diagram of a structure of a step-up circuit according to claim 3.
Figure 5:
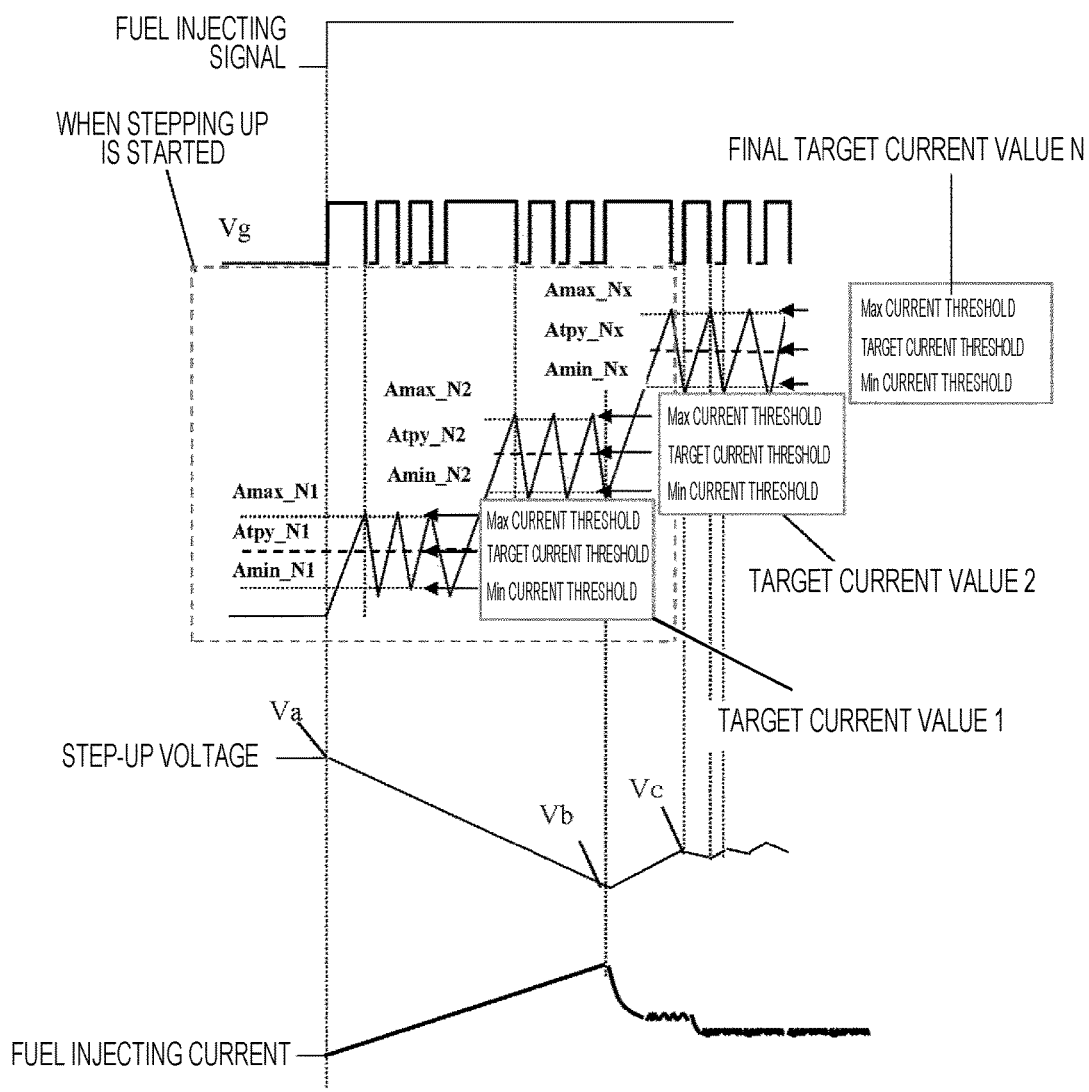
FIG. 5 is a diagram of a step-up current waveform in a case where stepping up is performed in a stepwise manner according to claim 3.

FIGS. 4 and 5 are diagrams to describe an embodiment according to claims 3 and 4 of the present invention. Relative to FIG. 1, step-up current thresholds (plural) 14 are illustrated in FIG. 4. According to this, a plurality of Max current values, target current values, and Min current values illustrated in FIG. 2 are provided. A basic operation to step up is similar to that of the step-up circuit of the fuel injector driving circuit 10 described above. However, by having a plurality of step-up current thresholds 14 in the electronic control device according to claim 1, at the time of the current rise and drop, illustrated in FIG. 2, generated when stepping up is started and stopped, the current fluctuation caused until the current reaches the final target current is controlled in a stepwise manner at a plurality of times. A step-up current waveform in a case where stepping up is performed in a stepwise manner is illustrated in FIG. 5. At the timing when the injection to the fuel driving valve is started, a step-up operation is started. Based on the voltage detected by the voltage monitor 12 and information which has been previously set to the target current value 1 of the step-up current thresholds (plural) 14, in order to retain the current of the target current value 1, the step-up gate control circuit 11 controls ON/OFF of the switching element of the step-up driver 1 so that an upper and lower limit thresholds of the current do not exceed the threshold when the upper and lower limit thresholds of the current exceed the threshold. After the current of the target value current 1 has been retained for a certain time, by using the method similarly to the above, stepping up is performed to a target value currents 2 and 3 in a stepwise manner. Then, stepping up is performed to the final target current value N. When stepping up is stopped, similarly to the current rise at the time when stepping up is started, the current is retained and the voltage is reduced, which are caused by stepping up, repeatedly by using the plurality of target current values. Accordingly, the current is dropped in a stepwise manner.

Figure 6:
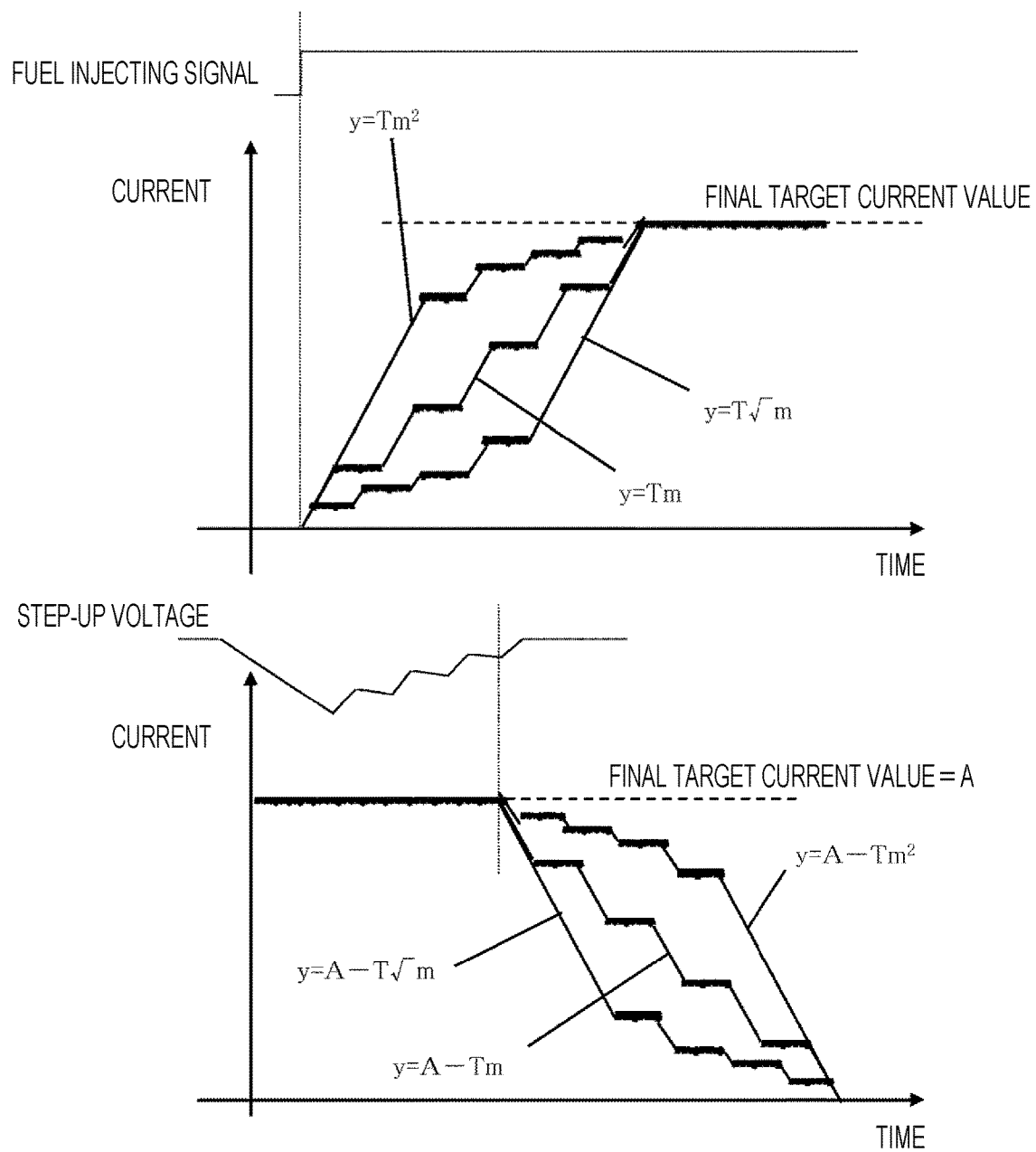
FIG. 6 is a diagram of a current profile of a current rise and drop in a stepwise manner.

FIG. 6 is a diagram of an embodiment according to claims 5 and 6 of the present invention. The current profile at the time when the current is raised and dropped in a stepwise manner can be determined based on the retaining time of the target current value, the threshold of the target current value, and the number of set target values. A typical example of the current profile at the time when the current is raised and dropped is illustrated in FIG. 6. An inclination by a circuit performance is represented by T, and the current is represented by y. The number of times of control at the time when stepping up is controlled is represented by m, and a target current value immediately before the current drop is started is represented by A. In this case, it can be considered that $y=T\times m2$, $y=T\times m$, and $y=T\times\sqrt{m}$ be satisfied when the current is raised and $y=A-T\times m2$, $y=A-T\times m$, and $y=A-T\times\sqrt{m}$ be satisfied when the current is dropped.

REFERENCE SIGNS LIST 1 step-up driver
2 battery 3 shunt resistor
4 step-up coil
5 step-up circuit driving unit
6 step-up diode
7 step-up capacitor
8 circuit for monitoring step-up voltage
9 driver IC
10 fuel injector driving circuit
11 step-up gate control circuit
12 voltage monitor
14 step-up current threshold table (plural)
15 counter circuit
16 time threshold table

The invention claimed is:

1. An electronic control device comprising:
a step-up switching element, a coil, and a diode configured to generate a step-up voltage; and
a capacitor mounted to store the step-up voltage, wherein
current values at a time of a current rise when stepping up is started are controlled in a stepwise manner such that a plurality of current values are used as a current is increased in the stepwise manner during the current rise, and the current values at a time of a current drop when stepping up is stopped are controlled in the stepwise manner such that the plurality of current values are used as the current is decreased in the stepwise manner during the current drop.

2. The electronic control device according to claim 1, wherein
the current values are controlled in the stepwise manner by varying ON/OFF Duty of the step-up switching element and a frequency.

3. The electronic control device according to claim 1, further comprising:
a current monitor circuit configured to perform current control to step up, wherein
a plurality of target current values to control stepping up is provided.

4. The electronic control device according to claim 3, wherein
each of the plurality of target current values is provided with upper and lower limit thresholds of the current, and
when the current exceeds a respective target current value of the plurality of target current values, the step-up switching element retains and controls the current so that the current does not exceed the upper and lower limit thresholds of the respective target current value immediately.

5. The electronic control device according to claim 3, wherein
each of the plurality of target current values is provided with upper and lower limit thresholds of the current,
when the current exceeds a respective target current value of the plurality of target current values, the step-up switching element retains and controls the current so that the current does not exceed the upper and lower limit thresholds of the respective target current value immediately, and
a current profile at the time of the current rise in a stepwise manner is varied based on a retaining time to retain and control the current.

6. The electronic control device according to claim 3, wherein
each of the plurality of target current values is provided with upper and lower limit thresholds of the current,
when the current exceeds a respective target current value of the plurality of target current values, the step-up switching element retains and controls the current so that the current does not exceed the upper and lower limit thresholds of the respective target current value immediately, and
a current profile at the time of the current drop in a stepwise manner is varied based on a retaining time to retain and control the current.

* * * * *